United States Patent
Bruekers et al.

(10) Patent No.: US 6,348,879 B1
(45) Date of Patent: Feb. 19, 2002

(54) EFFICIENT CODING OF SIDE INFORMATION IN A LOSSLESS ENCODER

(75) Inventors: Alphons A. M. L. Bruekers; Adriaan J. Rijnberg, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/479,641

(22) Filed: Jan. 7, 2000

(30) Foreign Application Priority Data

Jan. 7, 1999 (EP) .............................................. 99200013
Jul. 16, 1999 (EP) .............................................. 99202352

(51) Int. Cl.[7] .............................................. H03M 7/00
(52) U.S. Cl. ............................ 341/50; 341/51; 375/122
(58) Field of Search ............................... 341/50, 51, 61, 341/106, 107, 65, 143, 67, 59; 375/122

(56) References Cited

U.S. PATENT DOCUMENTS

| 5,214,678 A | * | 5/1993 | Rault et al. | .................. 375/122 |
| 5,581,653 A | | 12/1996 | Todd | .......................... 395/2.38 |
| 6,121,904 A | * | 9/2000 | Levine | ......................... 341/65 |
| 6,144,320 A | * | 11/2000 | Van Der Vleuten | .......... 341/50 |

* cited by examiner

Primary Examiner—Brian Young
Assistant Examiner—John Nguyen
(74) Attorney, Agent, or Firm—Michael E. Belk

(57) ABSTRACT

For "Super Audio CD" (SACD) the DSD signals are losslessly coded, using framing, prediction and entropy coding. Besides the efficiently encoded signals, a large number of parameters, i.e. the side-information, has to be stored on the SACD too. The smaller the storage capacity that is required for the side-information, the better the overall coding gain is. Therefore coding techniques are applied to the side-information too so as to compress the amount of data of the side information.

30 Claims, 3 Drawing Sheets

EFFICIENT CODING OF SIDE INFORMATION IN A LOSSLESS ENCODER

BACKGROUND OF THE INVENTION ART

1. Field of the Invention

The invention relates to an apparatus for lossless encoding of a digital information signal, for a lossless encoding method, to an apparatus for decoding and to a record carrier.

2. Description of the Related

For "Super Audio CD" (SACD) the DSD signals are losslessly coded, using framing, prediction and entropy coding. Besides the efficiently encoded signals, a large number of parameters, i.e. the side-information, has to be stored on the SACD too. The smaller the storage capacity that is required for the side-information, the better the overall coding gain is. Therefore coding techniques are applied to the side-information too. A description of the lossless encoding of DSD signals is given in the publication 'Improved lossless coding of 1-bit audio signals', by F. Bruekers et al, preprint 4563(I-6) presented at the $103^{rd}$ convention of the AES, Sep. 26–29, 1997 in New York.

SUMMARY OF THE INVENTION

The invention aims at providing methods that can be used e.g. in SACD to save on the number of bits that have to be used for storing the side-information. In the following description those methods will be presented.

BRIEF DESCRIPTION OF THE DRAWINGS

These and other aspects of the invention will be further explained hereafter in the figure description, in which.

DESCRIPTION OF PREFERRED EMBODIMENTS OF THE INVENTION

The process of lossless encoding and decoding, for the example of 1-bit oversampled audio signals, will be explained briefly hereafter by means of FIG. 1, which shows an embodiment of the encoder apparatus in FIG. 1a and shows an embodiment of the decoder apparatus in FIG. 1b.

Figure 1A:
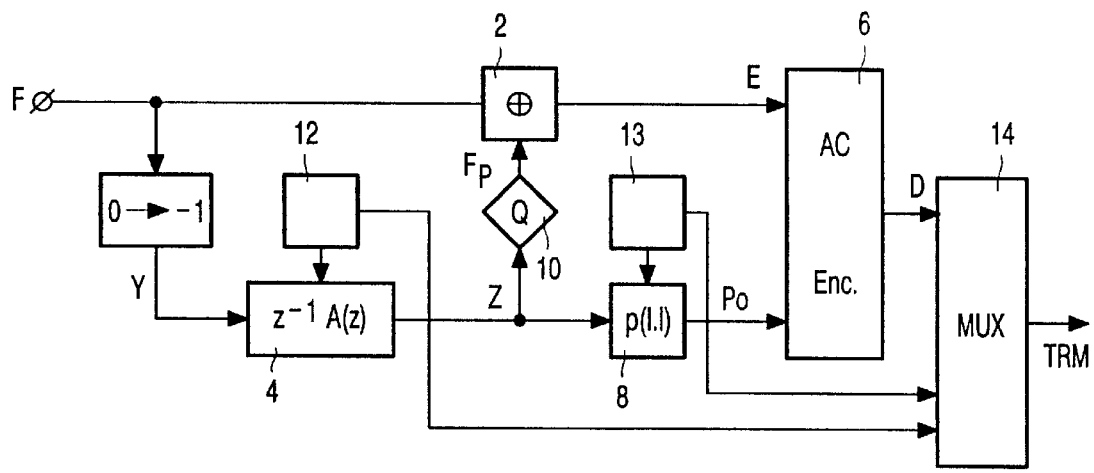
FIG. 1a shows a circuit diagram of a lossless encoder and FIG. 1b shows a circuit diagram of a corresponding decoder, using linear prediction and arithmetic coding.

The lossless coding in the apparatus of FIG. 1a is performed on isolated parts (frames) of the audio signal. A typical length of such a frame is 37632 bits. The two possible bit-values of the input signal F, '1' and '0', represent the sample values +1 and −1 respectively. Per frame, the set of coefficients for the prediction filter $z^{-1}.A(z)$, denoted by 4, is determined in a filter coefficient generator unit 12, by e.g. the autocorrelation method. The sign of the filter output signal, Z, determines the value of the predicted bit $F_p$, whereas the magnitude of the filter output signal, Z, is an indication for the probability that the prediction is correct. Upon quantizing the filter output signal Z in a quantizer 10, a predicted input signal $F_p$ is obtained, which is ex-ored in a combining unit 2, resulting in a residual signal E. A correct prediction, or $F=F_p$, is equivalent to E=0 in the residual signal E. The content of the probability table, p(|.|), is designed per frame such that per possible value of Z, $p_0$ is the probability that E=0. For small values of |Z| the probability for a correct prediction is close to 0.5 and for large values of |Z| the probability for a correct prediction is close to 1.0. Clearly the probability for an incorrect prediction, $F \neq F_p$ or E=1, is $p_1=1-p_0$.

The probability tables for the frames (or segments, to be described later) are determined by the unit 13. Using this probability table, supplied by the unit 13 to the unit 8, the unit 8 generates a probability value $P_0$ in response to its input signal, which is the signal Z.

The arithmetic encoder (AC Enc.) in the apparatus of FIG. 1a, denoted by 6, codes the sequence of bits of E such that the code (D) requires less bits. For this, the arithmetic coder uses the probability that bit n of signal E, E[n], has a particular value. The number of bits to code the bit E[n]=0 is:

$$d_n = -{}^2\log(p_0) + \epsilon \text{(bits)} \quad \text{(Eq. 1)}$$

which is practically not more than 1 bit, since $p_0 \geq \frac{1}{2}$. The number of bits to code the bit E[n]=1 is:

$$d_n = -{}^2\log(p_1) + \epsilon = -{}^2\log(1-p_0) + \epsilon \text{(bits)} \quad \text{(Eq. 2)}$$

which is not less than 1 bit. The $\epsilon$ in both equations represents the non-optimal behavior of the arithmetic coder, but can be neglected in practice.

A correct prediction (E[n]=0) results in less than 1 bit and an incorrect prediction (E[n]=1) results in more than 1 bit in the code (D). The probability table is designed such that on the average for the complete frame, the number of bits for code D is minimal.

Besides code D, also the coefficients of the prediction filter 4, generated by the coefficient generator unit 12, and the content of the probability table, generated by the probability table determining unit 13, have to be transmitted from encoder to decoder. To that purpose, the encoder apparatus comprises a multiplexer unit 14, which receives the output signal of the coder 6, as well as side information from the generator units 12 and 13. This side information comprises the prediction filter coefficients and the probability table. The multiplexer unit 14 supplies the serial datastream of information to a transmission medium, such as a record carrier.

Figure 1B:
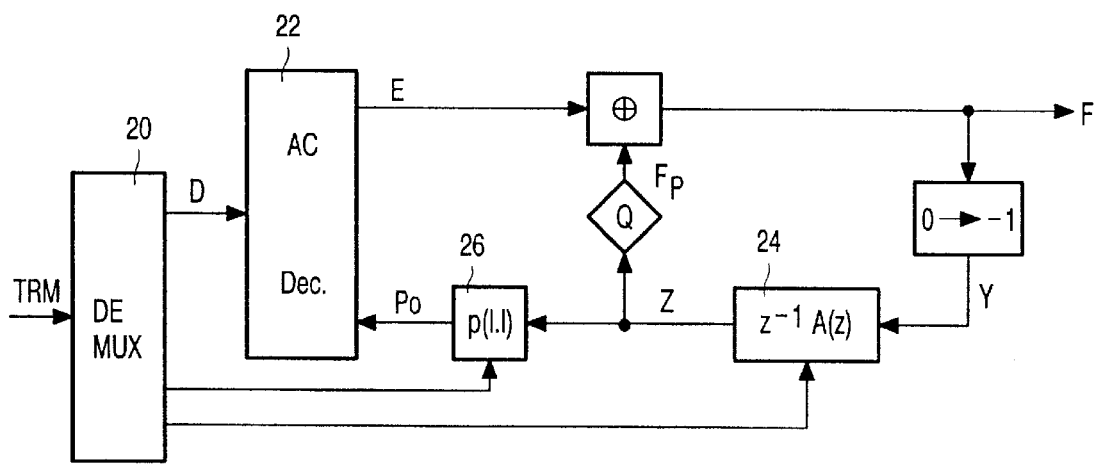

In the decoder apparatus of FIG. 1b, exactly the inverse of the encoder process is implemented thus creating a lossless coding system. The demultiplexer unit 20 receives the serial datastream comprising the data D and the side information. It retrieves the data D therefrom and supplies the data D to an arithmetic decoder 22. The arithmetic decoder (AC Dec.) is provided with the identical probabilities as the arithmetic encoder was, to retrieve the correct values of signal E. Therefore the demultiplexer unit retrieves the same prediction filter coefficients and probability table as used the encoder from the serial datastream received and supplies the prediction filter coefficients to the prediction filter 24 and the probability table to the probability value generator unit 26.

The circuit constructions shown in FIG. 1 are meant for encoding/decoding a single serial datastream of information. Encoding/decoding a multi channel information signal, such as a multi channel digital audio signal, requires the processing described above with reference to FIG. 1 to be carried out in time multiplex by the circuits of FIG. 1, or can be carried out in parallel by a plurality of such circuits. Another solution can be found in international patent application IB 99/00313, which corresponds to U.S. Ser. No. 09/268,252 (PHN 16.805).

It should be noted here that in accordance with the invention, the encoding apparatus may be devoid of the quantizer Q and the combining unit 2. Reference is made to earlier patent publications discussing this.

In SACD the 1-bit audio channels are chopped into frames of constant length and per frame the optimal strategy for coding will be used. Frames can be decoded independently from neighbouring frames. Therefore we can discuss the data structure within a single frame.

Figure 2:
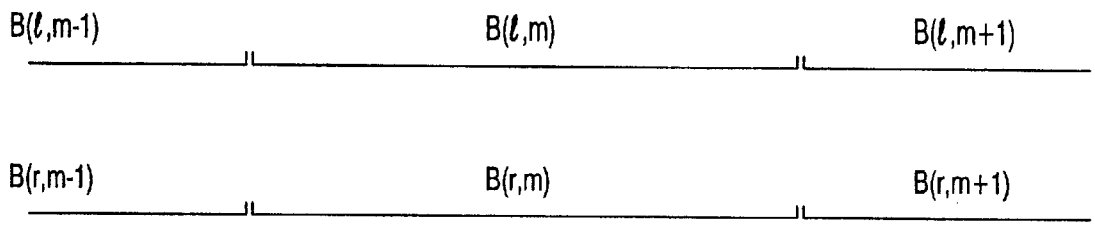
FIG. 2 shows subsequent frames of a multi channel information signal.
Figure 3:
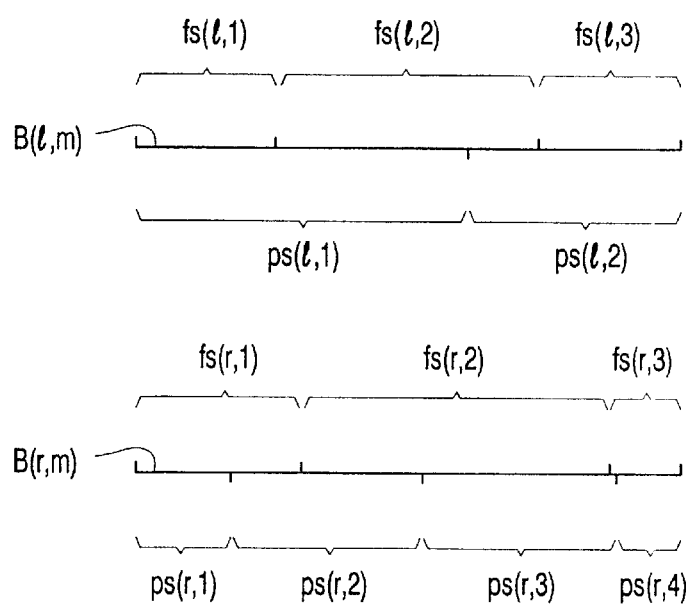
FIG. 3 shows the segmentation of time equivalent frames of the multi channel information signal.

FIG. 2 shows time equivalent frames B of two channel signals, such as the left and right hand signal component of a digital stereo audio signal, indicated by . . . , B(l,m−1), B(l,m), B(l,m+1), . . . for the left hand signal component and by . . . , B(r,m−1), B(r,m), B(r,m+1), . . . for the right hand signal component. The frames can be segmented, as will be explained hereafter. If not segmented, the frames will be encoded in their entirety, with one set of filter coefficients and one probability table for the complete frame. If segmented, each segment in a frame can have its own set of filter coefficients and probability table. Furthermore, the segmentation in a frame for the filtercoefficients need not be the same as for the probability tables. As an example, FIG. 3 shows the two time equivalent frames B(l,m) and B(r,m) of the two channel signals being segmented. The frame B(l,m) has been segmented into three segments fs(l,1), fs(l,2) and fs(l,3) in order to carry out three different prediction filterings in the frame. It should however be noted that the filterings in two segments, such as the segments fs(l,1) and fs(l,3) can be the same. The frame B(l,m) has further been segmented into two segments ps(l,1) and ps(l,2) in order to have two different probability tables for those segments.

The frame B(r,m) has been segmented into three segments fs(r,1), fs(r,2) and fs(r,3) in order to carry out three different prediction filterings in the frame. It should however again be noted that the filterings in two segments, such as the segments fs(r,1) and fs(r,3) can be the same. The frame B(r,m) has further been segmented into four segments ps(r,1), ps(r,2), ps(r,3) and ps(r,4) in order to have four different probability tables for those segments. Again, it should be noted that some of the segments can have the same probability table.

The decision to have the same probability table for different segments can be taken on beforehand by a user of the apparatus, after having carried out a signal analysis on the signals in the segments. Or the apparatus may be capable of carrying out this signal analysis and decide in response thereto. In some situations, a signal analysis carried out on two segments may result in probability tables that differ only slightly. In such situation, it can be decided to have one and the same probability table for both segments. This one probability table could be equal to one of the two probability tables established for the two segments, or could be an averaged version of both tables. An equivalent reasoning is valid for the sets of filter coefficients in the various segments.

To summarize: in order to encode a small portion of audio in an audio channel signal, the coding algorithm in SACD requires both a prediction filter (the filter) and a probability table (the table).

For improving the coding gain it can be efficient to use different filters in different channels. But also within the same channel is can be beneficial to use different filters. That is why the concept of segmentation is introduced. A channel is partitioned into segments and in a segment a particular filter is used. Several segments, also from other channels, may use the same or a different filter. Besides storage of the filters that are used, also information about the segments (segmentation) and information about what filter is used in what segment (mapping) have to be stored.

For the tables, the same idea is applicable, however the segmentation and mapping may be different from the segmentation and mapping for the filters. In case of equal segmentation for both filter and table this is indicated. The same idea is used for the mapping. If the segmentation for the filters is equal for all channels this is indicate too. The same idea is used for the mapping.

Figure 4:
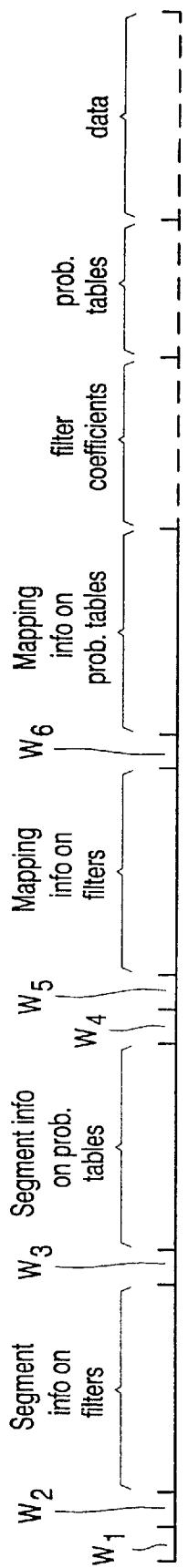
FIG. 4 shows the contents of a frame of the output signal of the encoding apparatus.

First, a description will be given of the contents of a frame of a transmission signal comprising the encoded channel signals and the corresponding side information. FIG. 4 shows a schematic drawing of the frame. Apart from synchronization information (not shown), the frame comprises two words $w_1$ and $w_2$, followed by segmentation information on the prediction filters. Next a word $W_3$ is present followed by segmentation information on the probability tables. Next follow two words $W_4$ and $w_5$, followed by mapping information on the prediction filters. Next, follows a word $w_6$, followed by mapping information on the probability tables. Next follow the filter coefficients and the probability tables, as supplied by the generator units 12 and 13, respectively. The frame ends with the data D, supplied by the arithmetic encoder 6.

The word $w_1$ is in this example one bit long and can have the value '0' or '1', and indicates whether the segment information for the filter coefficients and the probability tables are the same ('1'), or not ('0'). The word $W_4$ is in this example one bit long and can have the value '0' or '1', and indicates whether the mapping information for the filter coefficients and the probability tables are the same ('1'), or not ('0'). The word $w_2$, again one bit long, can have the value '0' or '1', and indicates whether the channel signals have the same segmentation information for the prediction filter coefficients ('1'), or not ('0'). The word $W_3$ (one bit long) can have the value '0' or '1', and indicates whether the channel signals have the same segmentation information for the probability tables ('1'), or not ('0'). The word $W_5$ can have the value '0' or '1', and indicates whether the channel signals have the same mapping information for the prediction filter coefficients ('1'), or not ('0'). The word $w_6$ can have the value '0' or '1', and indicates whether the channel signals have the same mapping information for the probability tables ('1'), or not ('0').

First, the representation of the total number of segments S in a frame will be described.

To code a number, e.g. the total number of segments in a frame in a particular channel signal, a kind of run-length coding is applied. It is important that the code is short for small values of S. Since the number of segments in a channel $S \geq 1$, S=0 needs not to be coded. In SACD the following codes are used.

TABLE 1

| S | code(S) |
|---|---------|
| 1 | 1 |
| 2 | 01 |
| 3 | 001 |
| 4 | 0001 |
| s | $0^{(s-1)}1$ |

Remark: Here the "1" is used as delimiter. It is clear that in general the role of the "0" and "1" can be interchanged. The basic idea of the delimiter is that a certain sequence is violated; the sequence of "0's" is violated by a "1". An alternative is e.g. to "inverse" the next symbol and "no inversion" is used as a delimiter. In this way long constant sequences are avoided. An example of inverting sequences that start with an "1" is (not used in SACD):

| S | code(S) |
|---|---------|
| 1 | 0 |
| 2 | 11 |
| 3 | 100 |
| 4 | 1011 |
| 5 | 10100 |
| 6 | 101011 |

Second, the representation of the segment sizes will be described. The length of a segment will be expressed in number of bytes of the channel signal. The B bytes in a frame of a channel signal are partitioned into S segments. For the first S−1 segments the number of bytes of each segment has to be specified. For the $S^{th}$ segment the number of bytes is specified implicitly, it is the remaining number of bytes in the channel. The number of bytes in segment i, equals $B_i$ so the number of bytes in the last segment is:

$$B_{s-1} = B - \sum_{i=0}^{s-2} B_i$$

Since the number of bytes in the first S−1 segments are multiples of R, the resolution R≧1, we define:

$$B_i = b_i R$$

and consequently:

$$B_{s-1} = B - \sum_{i=0}^{s-2} b_i R$$

The S−1 values of $b_i$ are stored and R is stored in a channel only if S>1 and when it is not stored already for another channel.

The number of bits required to store $b_i$ depends on its possible values.

$$0 \leq b_i \leq b_{i,max}$$

with e.g.

$$b_{i,max} = \left\lfloor \frac{B}{R} \right\rfloor - \sum_{j=0}^{i-1} b_j$$

so the required number of bits to store $b_i$ is:

$$\#bits(b_i) = \lfloor {}^2\log(b_{i,max}) \rfloor + 1$$

This has as advantage that the required number of bits for the segment length may decrease for segments at the end of the frame. If restrictions are imposed on e.g. minimal length of a segment the calculation of the number of bits may be adapted accordingly. The number of bits to store the resolution R is: #bits(R)

Third, the representation of the segmentation information in the serial datastream will be described. Use will be made of the representations given above under table 1. This will be illustrated by some examples. In order to distinguish between filters and probability tables, the subscripts f and t are used. To distinguish between segments in different channels the double argument is used: (channel number, segment number).

Next follows a first example. For a 2-channel case, we have different segmentations for filters and probability tables, and the segmentation is different for both channels. The following table shows the parameters in the stream.

TABLE 2

| Value | #bits | comment |
|-------|-------|---------|
| ($w_1$ =) 0 | 1 | segmentation information for the filters is different from the segmentation for the probability tables<br>filter segmentation |
| ($w_2$ =) 0 | 1 | channels have own filter segmentation information<br>filter segmentation in channel 0 |
| ($y_1$ =) 0 | 1 | first bit of code($S_f$(0)) indicating that $S_f$(0) ≧ 2 |
| $R_f$ | #bits($R_f$) | resolution for filters |
| $b_f$(0,0) | #bits($b_f$(0,0)) | first segment in channel 0 has length $R_f b_f$(0,0) bytes |
| ($y_2$ =) 1 | 1 | last bit of code($S_f$(0)) indicating that $S_f$(0) = 2<br>filter segmentation in channel 1 |
| ($y_1$ =) 0 | 1 | first bit of code($S_f$(1)) indicating that $S_f$(1) ≧ 2 |
| $b_f$(1,0) | #bits($b_f$(1,0)) | first segment in channel 1 has length $R_f b_f$(1,0) bytes |
| ($y_2$ =) 0 | 1 | second bit of code($S_f$(1)) indicating that $S_f$(1) ≧ 3 |
| $b_f$(1,1) | #bits($b_f$(1,1)) | second segment in channel 1 has length $R_f b_f$(1,1) bytes |
| ($y_3$ =) 1 | 1 | last bit of code($S_f$(1)) indicating that $S_f$(1) = 3<br>probability table segmentation |
| ($w_3$ =) 0 | 1 | channels have own table segmentation specification<br>probability table segmentation in channel 0 |
| ($y_1$ =) 1 | 1 | last bit of code($S_t$(0)) indicating that $S_t$(0) = 1<br>probability table segmentation in channel 1 |
| ($y_1$ =) 0 | 1 | first bit of code($S_t$(1)) indicating that $S_t$(1) ≧ 2 |
| $R_t$ | #bits($R_t$) | resolution for tables |
| $b_t$(1,0) | #bits($b_t$(1,0)) | first segment in channel 1 has length $R_t\,b_t$(1,0) bytes |
| ($y_2$ =) 0 | 1 | second bit of code($S_t$(1)) indicating that $S_t$(1) ≧ 3 |
| $b_t$(1,1) | #bits($b_t$(1,1)) | second segment in channel 1 has length $R_t\,b_t$(1,1) bytes |
| ($y_3$ =) 1 | 1 | last bit of code($S_t$(1)) indicating that $S_t$(1) = 3 |

In the above table 2, the first combination ($Y_1$,$Y_2$) equal to (0,1) is the codeword code(S) in table 1 above, and indicates that in the channel signal numbered 0 the frame is divided into two segments for the purpose of prediction filtering. Further, the combination ($y_1$,$Y_2$,$y_3$) equal to (0,0,1) is the codeword code(S) in table 1 above, and indicates that in the channel signal numbered 1 the frame is divided into three segments for the purpose of prediction filtering. Next, we find a combination ($y_1$) equal to (1), which is the first codeword in table 1, indicating that the channel signal numbered 0, the frame is not divided for the probability table. Finally, we find a combination ($Y_1$,$y_2$,$y_3$) equal to (0,0,1), which indicates that the frame of the second channel signal is divided into three segments, each with a corresponding probability table.

Next, follows another example for a 5-channel case.- It is assumed that for this 5-channel case, we have equal segmentation for filters and tables, and the segmentation is equal for all channels.

| Value | #bits | comment |
|---|---|---|
| ($w_1$ =) 1 | 1 | the segmentation information for the prediction filters and probability tables is the same |
| | | filter segmentation |
| ($w_2$ =) 1 | 1 | channels have equal filter segmentation information |
| | | filter segmentation in channel 0 |
| ($y_1$ =) 0 | 1 | first bit of code($S_f(0)$) indicating that $S_f(0) \geq 2$ |
| $R_f$ | #bits($R_f$) | resolution for filters |
| $b_f(0,0)$ | #bits($b_f(0,0)$) | first segment in channel 0 has length $R_f$ $b_f(0,0)$ bytes |
| ($y_2$ =) 0 | 1 | second bit of code($S_f(0)$) indicating that $S_f(0) \geq 3$ |
| $b_f(0,4)$ | #bits($b_f(0,1)$) | second segment in channel 0 has length $R_f$ $b_f(0,1)$ bytes |
| ($y_3$ =) 1 | 1 | last bit of code($S_f(0)$) indicating that $S_f(0) = 3$ |
| | | filter segmentation in channel c |
| | | $b_f(c,0) = b_f(0,0)$ and $b_f(c,1) = b_f(0,1)$ for $1 \leq c < 5$ |
| | | probability table segmentation in channel c |
| | | $b_t(c,0) = b_f(0,0)$ and $b_t(c,1) = b_f(0,1)$ for $0 \leq c < 5$ |

Remark: The single bits of code(S) interleaved in de segmentation information can be interpreted as "another segment will be specified" in case of "0" or "no more segments will be specified" in case of "1".

Next, mapping will be described.

For each of the segments, all segments of all channels are considered together, it has to be specified which filter or table is used. The segments are ordered; first the segments of channel 0 followed by the segments of channel 1 and so on.

The filter or table number for segment s, N(s) is defined as:

$$\begin{cases} N(0) = 0 \\ 0 \leq N(s) \leq N_{max}(s) \end{cases}$$

with $N_{max}(s)$, the maximum allowed number for a given segment, defined as:

$$N_{max}(s) = 1 + \max(N(i)) \text{ with } 0 \leq i < s$$

The required number of bits to store N(s) equals:

$$\#bits(N(s)) = \lfloor {}^2\log(N_{max}(s)) \rfloor + 1$$

The number of bits that is required to store a filter or table number according to this method depends on the set of numbers that already has been assigned.

If the tables use the same mapping as the filters, which is not always possible, this is indicated. Also when all channels use the same mapping this is indicated.

With two examples the idea will be illustrated.

EXAMPLE 3

Assume that in total we have 7 segments (0 through 6), some segments use the same filter and some use a unique filter. Furthermore it is assumed that the tables use the same mapping specification as the filters.

| Channel number | Segment number | Filter number | Possible filter numbers | #bits |
|---|---|---|---|---|
| 0 | 0 | 0 | — | 0 |
| 1 | 1 | 0 | 0 or 1 | 1 |
| 1 | 2 | 1 | 0 or 1 | 1 |
| 1 | 3 | 2 | 0, 1 or 2 | 2 |
| 1 | 4 | 3 | 0, 1, 2 or 3 | 2 |
| 2 | 5 | 3 | 0, 1, 2, 3 or 4 | 3 |
| 3 | 6 | 1 | 0, 1, 2, 3 or 4 | 3 |
| | | | Total #bits | 12 |

Segment number 0 uses filter number 0 per definition, so no bits are needed for this specification. Segment number 1 may use an earlier assigned filter (0) or the next higher not yet assigned filter (1), so 1 bit is needed for this specification. Segment number 1 uses filter number 0 in this example. Segment number 2 may use an earlier assigned filter (0) or the next higher not yet assigned filter (1), so 1 bit is needed for this specification. Segment number 2 uses filter number 1 in this example.

Segment number 3 may use an earlier assigned filter (0 or 1) or the next higher not yet assigned filter (2), so 2 bits are needed for this specification. Segment number 3 uses filter number 2 in this example.

Segment number 4 may use an earlier assigned filter (0,1 or 2) or the next higher not yet assigned filter (3), so 2 bits are needed for this specification. Segment number 4 uses filter number 3 in this example. Segment number 5 may use an earlier assigned filter (0,1,2 or 3) or the next higher not yet assigned filter (4), so 3 bits are needed for this specification. Segment number 5 uses filter number 3 in this example.

Segment number 6 may use an earlier assigned filter (0,1,2 or 3) or the next higher not yet assigned filter (4), so 3 bits are needed for this specification. Segment number 6 uses filter number 1 in this example.

In total 12 bits are required to store the mapping. The total number of segments (7 segments in this example) is known at this point in the stream.

| Value | #bits | comment |
|---|---|---|
| ($w_4$ =) 1 | 1 | probability tables have same mapping information as prediction filters |
| | | prediction filter mapping |
| ($w_5$ =) 0 | 1 | channels have own filter segmentation information |
| | 0 | filter number for segment 0 is 0 per definition |
| $N_f(1)$ | #bits($N_f(1)$) | filter number for segment 1 |
| $N_f(2)$ | #bits($N_f(2)$) | filter number for segment 2 |
| $N_f(3)$ | #bits($N_f(3)$) | filter number for segment 3 |
| $N_f(4)$ | #bits($N_f(4)$) | filter number for segment 4 |
| $N_f(5)$ | #bits($N_f(5)$) | filter number for segment 5 |
| $N_f(6)$ | #bits($N_f(6)$) | filter number for segment 6 |
| | | probability table mapping |
| | | $N_t(i) = N_f(i)$ for $0 \leq i < 7$ |

Another example. Assume that in total we have 6 channels each with 1 segment and each segment uses the same prediction filter and the same probability table.

| Value | #bits | comment |
|---|---|---|
| ($w_4$ =) 1 | 1 | probability tables have same mapping information as prediction filters prediction filter mapping |
| ($w_5$ =) 1 | 1 0 | channels have own filter mapping specification filter number for segment 0 is 0 per definition prediction filter mapping for segment i<br><br>$N_f(i) = 0$ for $1 \leq i < 6$<br>probability table mapping for segment i<br><br>$N_t(i) = N_f(i)$ for $0 \leq i < 6$ |

In total 2 bits are required to store the complete mapping.

Remark: A reason to give the indication that a following specification is also used for other application (e.g. for tables the same segmentation is used as for the filters) is that this simplifies the decoder.

Whilst the invention has been described with reference to preferred embodiments thereof, it is to be understood that these are not limitative examples. Thus, various modifications may become apparent to those skilled in the art without departing from the scope of the invention as defined by the claims. As an example, the invention could also have been incorporated in an embodiment in which time equivalent signal blocks are encoded, without making use of segmentation. In such embodiment, the serial datastream obtained, like the datastream of FIG. 4, will be devoid of the segment information described there for the filters and the probability tables, as well as some of the indicator words, such as the indicator words $w_1$, $w_2$ and $W_3$. Further, the invention lies in each and every novel feature and combination of features.

What is claimed is:

1. Apparatus for encoding of a digital information signal, such as an n-channel digital audio signal, where n is an integer larger than 1, comprising
   input means for receiving the digital information signal,
   encoding means for encoding the digital information signal so as to obtain an encoded digital information signal, the encoding means being adapted to encode each of said channel signals of the n-channel digital audio signal so as to obtain an encoded channel signal for each of said channel signals in response to probability values for each of said channel signals,
   prediction filter means for carrying out a prediction filtering on each of said channel signals of the n-channel digital audio signal in response to a set of prediction filter coefficients for each of said channel signal so as to obtain a prediction filtered channel signal from each of said channel signals,
   prediction filter coefficient determining means for generating a set of prediction filter coefficients for each of said channel signals,
   probability value determining means for generating probability values for each of said channel signals in response to a probability table for each of said channel signals and the corresponding prediction filtered channel signal for each of said channel signals,
   probability table determining means for generating the probability tables for each of said channel signals,
   converting means for generating first mapping information and a plurality of m sets of prediction filter coefficients, where m is an integer for which holds $1 \leq m \leq n$, said first mapping information and m sets of prediction filter coefficients being representative of said n sets of prediction filter coefficients for said n channels, and for generating second mapping information and a plurality of p probability tables, where p is an integer for which holds $1 \leq p \leq n$, said second mapping information and p probability tables being representative of said n probability tables for said n channels,
   combining means for combining said compressed digital information signal, said first and second mapping information signals, said plurality of m sets of prediction filter coefficients and said plurality of p probability tables into a composite information signal,
   output means for outputting said composite information signal.

2. Apparatus as claimed in claim 1, the encoding means being adapted to encode time equivalent signal blocks of each of said channel signals of the n-channel information signal, so as to obtain encoded time equivalent signal blocks for each of said signal blocks in response to probability values for each of said signal blocks, the prediction filter means being adapted to carry out a prediction filtering on each of said time equivalent signal blocks in response to said n sets of prediction filter coefficients, one for each time equivalent signal block, the probability table determining means being adapted to generate said n probability tables, one for each time equivalent signal block.

3. Apparatus as claimed in claim 2, wherein the conversion means is adapted to generate a first indicator word ($W_4$) of a first value, indicating that the mapping information for the probability tables is different from the mapping information for the prediction filter coefficients and of a second value indicating that the mapping information for the probability tables is the same as for the prediction filter coefficients, and for supplying the first or the second mapping information only in the latter case, the combining means being adapted to combine the first indicator word and the first mapping information or the second mapping information only into said composite information signal, in the case that the first indicator word has the second value.

4. Apparatus as claimed in claim 2, wherein the conversion means is adapted to generate a second indicator word ($w_5$) of a third value indicating that the time equivalent signal blocks all have the same mapping information for the sets of prediction filter coefficients and is adapted to generate a second indicator word of a fourth value indicating that the time equivalent signal blocks have each a different mapping information for the sets of prediction filter coefficients, that the converting means is adapted to generate second mapping information for only one time equivalent signal block in the case that the second indicator word has the third value and is adapted to generate second mapping information for each of the time equivalent signal blocks in the case that the second indicator word has the fourth value, and that the combining means is further adapted to combine the second indicator word into said composite information signal.

5. Apparatus as claimed in claim 2, wherein the first set of prediction filter coefficients is allocated to the first of said n time equivalent signal blocks, said second mapping information being devoid of mapping information for mapping said first set of prediction filter coefficients to said first time equivalent signal block of said n time equivalent signal blocks,
   (a) the first bit in said second mapping information indicating whether the set of prediction filter coefficients for the second time equivalent signal block is the first set of prediction filter coefficients or a second set of prediction filter coefficients, (b1) if the first set of prediction filter coefficients is also the set of filter coefficients for the second time equivalent signal block, then the second bit in said second mapping information indicating whether the set of prediction filter coefficients for the third time equivalent signal block is the first set of prediction filter coefficients or the second set of prediction filter coefficients, (b2) if the second set of prediction filter coefficients is the set of filter coefficients for the second time equivalent signal block, then the next two bits in the second mapping information indicating whether the set of prediction filter coefficients for the third time equivalent signal block is the first, the second or the third set of prediction filter coefficients, (c1) if the first set of prediction filter coefficients is the set of filter coefficients for the second and third time equivalent signal block, then the third bit of said second mapping information indicates whether the set of prediction filter coefficients for the fourth time equivalent signal block is the first or the second set of prediction filter coefficients, (c2) if the first set of prediction filter coefficients is the set of filter coefficients for the second time equivalent signal block and the second set of prediction filter coefficients is the set of filter coefficients for the third time equivalent signal block, then the third and fourth bit in said second mapping information indicating whether the set of prediction filter coefficients for the fourth time equivalent signal block is the first, the second or the third set of prediction filter coefficients, (c3) if the second set of prediction filter coefficients is the set of filter coefficients for the second time equivalent signal block, and the first or the second set of filter coefficients is the set of filter coefficients for the third time equivalent signal block, then the fourth and fifth bit in the second mapping information indicating whether the set of prediction filter coefficients for the fourth time equivalent signal block is the first, second or the third set of prediction filter coefficients, (c4) if the second set of prediction filter coefficients is the set of filter coefficients for the second time equivalent signal block, and the third set of filter coefficients is the set of prediction filter coefficients for the third time equivalent signal block, then the fourth and fifth bit in the second mapping information indicating whether the set of prediction filter coefficients for the fourth time equivalent signal block is the first, second, third or the fourth set of filter coefficients.

6. Apparatus as claimed in claim 2, wherein the first probability table is allocated to the first of said n time equivalent signal blocks, said first mapping information being devoid of mapping information for mapping said first probability table to said first time equivalent signal block of said n time equivalent signal blocks, (a) the first bit in said first mapping information indicating whether the probability table for the second time equivalent signal block is the first probability table or a second probability table, (b1) if the first probability table is also the probability table for the second time equivalent signal block, then the second bit in said first mapping information indicating whether the probability table for the third time equivalent signal block is the first probability table or the second probability table, (b2) if the second probability table is the probability table for the second time equivalent signal block, then the next two bits in the first mapping information indicating whether the probability table for the third time equivalent signal block is the first, the second or the third probability table, (c1) if the first probability table is the probability table for the second and third time equivalent signal block, then the third bit of said first mapping information indicates whether the probability table for the fourth time equivalent signal block is the first or the second probability table, (c2) if the first probability table is the probability table for the second time equivalent signal block and the second probability table is the probability table for the third time equivalent signal block, then the third and fourth bit in said first mapping information indicating whether the probability table for the fourth time equivalent signal block is the first, the second or the third probability table, (c3) if the second probability table is the probability table for the second time equivalent signal block, and the first or the second probability table is the probability table for the third time equivalent signal block, then the fourth and fifth bit in the first mapping information indicating whether the probability table for the fourth time equivalent signal block is the first, second or the third probability table, (c4) if the second probability table is the probability table for the second time equivalent signal block, and the third probability table is the probability table for the third time equivalent signal block, then the fourth and fifth bit in the first mapping information indicating whether the probability table or the fourth time equivalent signal block is the first, second, third or the fourth probability table.

7. Apparatus for encoding of a digital information signal, such as an n-channel digital audio signal, where n is an integer larger than 1, comprising input means for receiving the digital information signal, encoding means for encoding the digital information signal so as to obtain an encoded digital information signal, the encoding means being adapted to encode time equivalent signal blocks of each of said channel signals of the n-channel digital audio signal by dividing the time equivalent signal blocks into M segments, and encoding the signal portions of the channel signals in all M segments in said time equivalent signal blocks, so as to obtain an encoded signal portion for each of said signal portions in said M segments in response to probability values for each of said signal portions, where $$M = \sum_{i=0}^{i=n-1} sp_i$$

and $sp_i$ is the number of segments in the time equivalent signal block of the i-th channel signal, probability value determining means for generating probability values for each of said M signal portions in response to a probability table for each of said M signal portions, probability table determining means for generating the probability tables for each of said M signal portions, converting means for converting the information about the length and locations of the M segments in the n channel signals into first segment information, and for generating first mapping information and a plurality of m probability tables, where m is an integer for which holds 1≦m≦M, said first mapping information and said m probability tables being representative for said M probability tables, combining means for combining the portion of the encoded digital information signal comprised in said time equivalent signal blocks, said first segment information, said first mapping information signal and said plurality of m probability tables into a composite information signal, output means for outputting said composite information signal.

8. Apparatus as claimed in claim 7, further comprising prediction filter means for carrying out a prediction filtering on the digital information signal so as to obtain a prediction filtered digital information signal, the prediction filter means being adapted to prediction filter time equivalent signal blocks of each of said channel signals of the n-channel digital audio signal by dividing the time equivalent signal blocks into segments, and prediction filtering the signal portions of the channel signals in all P segments in said time equivalent signal blocks, so as to obtain a prediction filtered signal portion for each of said P signal portions in response to a set of prediction filter coefficients for each of said signal portions, where $$P = \sum_{i=0}^{i=n-1} sf_i$$

and $sf_i$ is the number of segments in the time equivalent signal block of the i-th channel signal, prediction filter coefficient determining means for generating a set of prediction filter coefficients for each of said P signal portions, the converting means further being adapted to convert the information about the length and locations of the P segments in the n channel signals into second segment information, and for generating second mapping information and a plurality of p sets of prediction filter coefficients, where p is an integer for which holds 1≦p≦P, said second mapping information and said p sets of prediction filter coefficients being representative of said P sets of prediction filter coefficients, the combining means further being adapted to combine said second segment information, said second mapping information signal and said plurality of p sets of prediction filter coefficients into said composite information signal.

9. Apparatus as claimed in claim 8, wherein the conversion means is adapted to generate a first indicator word ($w_i$) of a first value, indicating that the segmentation of the time equivalent signal blocks for the probability tables is different from the segmentation of the time equivalent signal blocks for the sets of prediction filter coefficients and of a second value indicating that the segmentation of the time equivalent signal blocks for the probability tables is the same as for the prediction filter coefficients, and for supplying only one of the first or the second segment information in the latter case, the combining means being adapted to combine the first indicator word and the only one of the first segment information or the second segment information into said composite information signal, in the case that the first indicator word has the second value.

10. Apparatus as claimed in claim 9, wherein the conversion means is adapted to generate said only one of the first or second segment information in the case that the first indicator word has the second value.

11. Apparatus as claimed in claim 8, wherein the conversion means is adapted to generate a second indicator word ($w_2$) of a third value indicating that the time equivalent signal blocks all have the same segmentation for the sets of prediction filter coefficients and is adapted to generate a second indicator word of a fourth value indicating that the time equivalent signal blocks have each a different segmentation for the sets of prediction filter coefficients, that the converting means is adapted to generate second segment information for only one time equivalent signal block in the case that the second indicator word has the third value and is adapted to generate second segment information for each of the time equivalent signal blocks in the case that the second indicator word has the fourth value, and that the combining means is further adapted to combine the second indicator word into said composite information signal.

12. Apparatus as claimed in claim 7, wherein the conversion means is adapted to generate a third indicator word ($W_3$) of a fifth value indicating that the time equivalent signal blocks all have the same segmentation for the probability tables and is adapted to generate a third indicator word of a sixth value indicating that the time equivalent signal blocks have each a different segmentation for the probability tables, that the converting means is adapted to generate first segment information for only one time equivalent signal block in the case that the third indicator word has the fifth value and is adapted to generate first segment information for each of the time equivalent signal blocks in the case that the third indicator word has the sixth value, and that the combining means is further adapted to combine the third indicator word into said composite information signal.

13. Apparatus as claimed in claim 8, wherein the conversion means is adapted to generate a fourth indicator word ($W_4$) of a seventh value, indicating that the mapping information for the probability tables is different from the mapping information for the prediction filter coefficients and of an eighth value indicating that the mapping information for the probability tables is the same as for the prediction filter coefficients, and for supplying the first or the second mapping information only in the latter case, the combining means being adapted to combine the fourth indicator word and the first mapping information or the second mapping information only into said composite information signal, in the case that the fourth indicator word has the eighth value.

14. Apparatus as claimed in claim 8, wherein the conversion means is adapted to generate a fifth indicator word ($w_5$) of a ninth value indicating that the time equivalent signal blocks all have the same mapping information for the sets of prediction filter coefficients and is adapted to generate a fifth indicator word of a tenth value indicating that the time equivalent signal blocks have each a different mapping information for the sets of prediction filter coefficients, that the converting means is adapted to generate second mapping information for only one time equivalent signal block in the case that the fifth indicator word has the ninth value and is adapted to generate second mapping information for each of the time equivalent signal blocks in the case that the fifth indicator word has the tenth value, and that the combining means is further adapted to combine the fifth indicator word into said composite information signal.

15. Apparatus as claimed in claim 8, wherein the first set of prediction filter coefficients is allocated to the first of said P segments, said second mapping information being devoid of mapping information for mapping said first set of prediction filter coefficients to said first segment of said P segments,
- (a) the first bit in said second mapping information indicating whether the set of prediction filter coefficients for the second segment is the first set of prediction filter coefficients or a second set of prediction filter coefficients,
- (b1) if the first set of prediction filter coefficients is also the set of filter coefficients for the second segment, then the second bit in said second mapping information indicating whether the set of prediction filter coefficients for the third segment is the first set of prediction filter coefficients or the second set of prediction filter coefficients,
- (b2) if the second set of prediction filter coefficients is the set of filter coefficients for the second segment, then the next two bits in the second mapping information indicating whether the set of prediction filter coefficients for the third segment is the first, the second or the third set of prediction filter coefficients,
- (c1) if the first set of prediction filter coefficients is the set of filter coefficients for the second and third segment, then the third bit of said second mapping information indicates whether the set of prediction filter coefficients for the fourth segment is the first or the second set of prediction filter coefficients,
- (c2) if the first set of prediction filter coefficients is the set of filter coefficients for the second segment and the second set of prediction filter coefficients is the set of filter coefficients for the third segment, then the third and fourth bit in said second mapping information indicating whether the set of prediction filter coefficients for the fourth segment is the first, the second or the third set of prediction filter coefficients,
- (c3) if the second set of prediction filter coefficients is the set of filter coefficients for the second segment, and the first or the second set of filter coefficients is the set of filter coefficients for the third segment, then the fourth and fifth bit in the second mapping information indicating whether the set of prediction filter coefficients for the fourth segment is the first, second or the third set of prediction filter coefficients,
- (c4) if the second set of prediction filter coefficients is the set of filter coefficients for the second segment, and the third set of filter coefficients is the set of prediction filter coefficients for the third segment, then the fourth and fifth bit in the second mapping information indicating whether the set of prediction filter coefficients for the fourth segment is the first, second, third or the fourth set of filter coefficients.

16. Apparatus as claimed in claim 7, wherein the first probability table is allocated to the first of said M segments, said first mapping information being devoid of mapping information for mapping said first probability table to said first segment of said M segments,
- (a) the first bit in said first mapping information indicating whether the probability table for the second segment is the first probability table or a second probability table,
- (b1) if the first probability table is also the probability table for the second segment, then the second bit in said first mapping information indicating whether the probability table for the third segment is the first probability table or the second probability table,
- (b2) if the second probability table is the probability table for the second segment, then the next two bits in the first mapping information indicating whether the probability table for the third segment is the first, the second or the third probability table,
- (c1) if the first probability table is the probability table for the second and third segment, then the third bit of said first mapping information indicates whether the probability table for the fourth segment is the first or the second probability table,
- (c2) if the first probability table is the probability table for the second segment and the second probability table is the probability table for the third segment, then the third and fourth bit in said first mapping information indicating whether the probability table for the fourth segment is the first, the second or the third probability table,
- (c3) if the second probability table is the probability table for the second segment, and the first or the second probability table is the probability table for the third segment, then the fourth and fifth bit in the first mapping information indicating whether the probability table for the fourth segment is the first, second or the third probability table,
- (c4) if the second probability table is the probability table for the second segment, and the third probability table is the probability table for the third segment, then the fourth and fifth bit in the first mapping information indicating whether the probability table or the fourth segment is the first, second, third or the fourth probability table.

17. Apparatus for decoding an encoded composite information signal comprising encoded data of an n-channel digital information signal, such as an n-channel digital audio signal, where n is an integer larger than 1, and side information having a relationship with said encoded digital information signal, the apparatus comprising input means for receiving a composite information signal, retrieval means for retrieving encoded data information and side information from said composite information signal, decoding means for decoding the encoded data information so as to obtain said n channel signals in response to a set of probability values for each of said channel signals, prediction filter means for carrying out a prediction filtering on each of said channel signals of the n-channel digital audio signal in response to n sets of prediction filter coefficients, one set for each of said channel signals, so as to obtain a prediction filtered channel signal from each of said channel signals, said sets of prediction filter coefficients being derived from said side information, probability value generator means for generating n sets of probability values, one for each of the channel signals in response to a corresponding prediction filtered channel signal and corresponding probability table, said n probability tables, one for each of the channel signals, being derived from said side information, the retrieval means further being adapted to retrieve first and second mapping information, a plurality of m sets of prediction filter coefficients and a plurality of p probability tables from said side information, reconverting means for reconverting said first mapping information and said m sets of prediction filter coefficients into n sets of prediction filter coefficients, one set for each of said channel signals, where m is an integer for which holds $1 \leq m \leq n$, and for reconverting said second mapping information and said p probability tables into n probability tables, one set for each of said channel signals, where p is an integer for which holds $1 \leq p \leq n$, output means for outputting said n channel signals.

18. Apparatus as claimed in claim 17, wherein said decoding means are adapted to decode the encoded data information into n time equivalent signal blocks, one for each of the n channel signals, the retrieval means being adapted to retrieve a first indicator word ($w_4$) from said side information, said first indicator word being of a first value, indicating that the mapping information for the probability tables is different from the mapping information for the sets of prediction filter coefficients and, when being of a second value, indicating that the mapping information for the probability tables is the same as for the prediction filter coefficients, that the retrieval means is further adapted to retrieve only one mapping information from the side information in the latter case, the reconverting means being further adapted to copy the mapping information retrieved in the case that the first indicator word has the eighth value.

19. Apparatus as claimed in claim 17, wherein said decoding means are adapted to decode the encoded data information into n time equivalent signal blocks, one for each of the n channel signals, the retrieval means being adapted to retrieve a second indicator word ($w_5$) from said side information, said second indicator word, when being of a third value, indicating that the time equivalent signal blocks all have the same mapping information for the prediction filter coefficients and, when being of a fourth value, indicating that the time equivalent signal blocks have each a different mapping information for the prediction filter coefficients, that the retrieval means are further adapted to retrieve second mapping information for only one time equivalent signal block in the case that the fifth indicator word has the third value and is adapted to retrieve second mapping information for each of the time equivalent signal blocks in the case that the fifth indicator word has the fourth value.

20. Apparatus as claimed in claim 17, wherein said decoding means are adapted to decode the encoded data information into n time equivalent signal blocks, one for each of the n channel signals, the retrieval means being adapted to retrieve a plurality of sets of prediction filter coefficients from said side information and to retrieve an array of bits from the second mapping information, the apparatus further comprising allocation means for allocating the first set of prediction coefficients to the first of said n time equivalent signal blocks, (a) the allocation means further being adapted to allocate the first set of prediction filter coefficients to the second time equivalent signal block in response to the first bit in the array of bits being of a first binary value and being adapted to allocate the second set of prediction filter coefficients to the second time equivalent signal block in response to the first bit being of the second binary value, (b1) if the first set of coefficients is also the set of filter coefficients for the second time equivalent signal block, then the allocation means is further adapted to allocate to allocate the first set of prediction filter coefficients to the third time equivalent signal block in response to the second bit in the array of bits being of a first binary value and is adapted to allocate the second set of prediction filter coefficients to the third time equivalent signal block in response to the second bit being of the second binary value, (b2) if the second set of coefficients is the set of filter coefficients for the second time equivalent signal block, then the allocation means is further adapted to allocate either the first or the second or the third set of prediction filter coefficients to the third time equivalent signal block in response to the values of the next two bits of the array of bits, (c1) if the first set of filter coefficients is the set of filter coefficients for the second and third time equivalent signal block, then the allocation means is further adapted to allocate either first or the second set of filter coefficients to the fourth time equivalent signal block in response to the value of the third bit of said array of bits, (c2) if the first set of prediction filter coefficients is the set of filter coefficients for the second time equivalent signal block and the second set of filter coefficients is the set of filter coefficients for the third time equivalent signal block, then the allocation means is further adapted to allocate either the first, or the second or the third set of prediction filter coefficients to the fourth time equivalent signal block in response to the values of the third and fourth bits in said array of bits, (c3) if the second set of prediction filter coefficients is the set of filter coefficients for the second time equivalent signal block, and the first or the second set of filter coefficients is the set of filters for the third time equivalent signal block, then the allocation means are adapted to allocate either the first, or second or the third set of filter coefficients to the fourth time equivalent signal block in response to the values of the fourth and fifth bit in the array of bits (c4) if the second set of prediction filter coefficients is the set of filter coefficients for the second time equivalent signal block, and the third set of filter coefficients is the set of filters for the third time equivalent signal block, then the allocation means are adapted to allocate either the first, or the second, or the third or the fourth set of filter coefficients to the fourth time equivalent signal block in response to the fourth and fifth bit in the array of bits.

21. Apparatus as claimed in claim 17, wherein said decoding means are adapted to decode the encoded data information into n time equivalent signal blocks, one for each of the n channel signals, the retrieval means being adapted to retrieve a plurality of probability tables from said side information and to retrieve an array of bits from the first mapping information, the apparatus further comprising allocation means for allocating the first probability table to the first of said n time equivalent signal blocks, (a) the allocation means further being adapted to allocate the first probability table to the second time equivalent signal block in response to the first bit in the array of bits being of a first binary value and being adapted to allocate the second probability table to the second time equivalent signal block in response to the first bit being of the second binary value, (b1) if the first probability table is also the probability table for the second time equivalent signal block, then the allocation means is further adapted to allocate the first probability table to the third time equivalent signal block in response to the second bit in the array of bits being of a first binary value and is adapted to allocate the second probability table to the third time equivalent signal block in response to the second bit being of the second binary value, (b2) if the second probability table is the probability table for the second time equivalent signal block, then the allocation means is further adapted to allocate either the first or the second or the third probability table to the third time equivalent signal block in response to the values of the next two bits of the array of bits, (c1) if the first probability table is the probability table for the second and third time equivalent signal block, then the allocation means is further adapted to allocate either first or the second probability table to the fourth time equivalent signal block in response to the value of the third bit of said array of bits, (c2) if the first probability table is the probability table for the second time equivalent signal block and the second probability table is the probability table for the third time equivalent signal block, then the allocation means is further adapted to allocate either the first, or the second or the third probability table to the fourth time equivalent signal block in response to the values of the third and fourth bits in said array of bits, (c3) if the second probability table is the probability table for the second time equivalent signal block, and the first or the second probability table is the probability table for the third time equivalent signal block, then the allocation means are adapted to allocate either the first, or second or the third probability table to the fourth time equivalent signal block in response to the values of the fourth and fifth bit in the array of bits (c4) if the second probability table is the probability table for the second time equivalent signal block, and the third probability table is the probability table for the third time equivalent signal block, then the allocation means are adapted to allocate either the first, or the second, or the third or the fourth probability table to the fourth time equivalent signal block in response to the fourth and fifth bit in the array of bits.

22. Apparatus for decoding an encoded composite information signal comprising encoded data of an n-channel digital information signal, such as an n-channel digital audio signal, where n is an integer larger than 1, and side information having a relationship with said encoded digital information signal, the apparatus comprising input means for receiving a composite information signal, retrieval means for retrieving encoded data information and side information from said composite information signal, decoding means for decoding the encoded data information into M signal portions in response to corresponding sets of probability values, one for each of said M signal portions, where $$M = \sum_{i=0}^{i=n-1} sp_i$$

and $sp_i$ is the number of segments in the time equivalent signal block of the i-th channel signal, probability value generator means for generating M sets of probability values, one for each of the M signal portions in response to a corresponding probability table, said M probability tables, one for each of the signal portions, being derived from said side information, the retrieval means further being adapted to retrieve first segment information and first mapping information and a plurality of m probability tables from said side information, where m is an integer for which holds $1 \leq m \leq M$, reconverting means for reconverting said first mapping information and m probability tables into M probability tables, one for each of said signal portions, and for reconverting said first segment information into information about the length and locations of the M segments in the n channel signals so as to obtain time equivalent signal blocks in said n channel signals, output means for outputting the time equivalent signal blocks of said n channel signals.

23. Apparatus as claimed in claim 22, further comprising prediction filter means for carrying out a prediction filtering on said time equivalent signal blocks of each of said channel signals of the n-channel digital information signal by dividing the time equivalent signal blocks into segments, and prediction filtering the signal portions of the channel signals in all P segments in said time equivalent signal blocks and for all n channel signals, so as to obtain a prediction filtered signal portion for each of said P signal portions in response to a set of prediction filter coefficients for each of said signal portions, where $$P = \sum_{i=0}^{i=n-1} sf_i$$

and $sf_i$ is the number of segments in the time equivalent signal block of the i-th channel signal, the retrieval means further being adapted to retrieve second segment information, second mapping information and p sets of prediction filter coefficients from said side information, where p is an integer for which holds $1 \leq p \leq P$, the reconverting means further being adapted to reconvert the second segment information into information about the length and locations of the P segments in the n channel signals and for reconverting the p sets of prediction filter coefficients into P sets of prediction filter coefficients, one for each of said P signal portions, using said second mapping information.

24. Apparatus as claimed in claim 23, wherein the retrieval means are adapted to retrieve a first indicator word ($w_1$) from said side information, said first indicator word, when being of a first value, indicating that the segmentation of the time equivalent signal blocks for the probability tables is different from the segmentation of the time equivalent signal blocks for the prediction filter coefficients, and when being of a second value, indicating that the segmentation of the time equivalent signal blocks for the probability tables is the same as for the prediction filter coefficients, and for retrieving one segment information only from the side information in the latter case, the reconverting means further being adapted to copy the said segment information so as to obtain the first and second segment information, in the latter case.

25. Apparatus as claimed in claim 23, wherein the retrieval means is adapted to retrieve a second indicator word ($w_2$) from said side information, said second indicator word, when being of a third value, indicating that the time equivalent signal blocks all have the same segmentation for the prediction filter coefficients and, when being of a fourth value, indicating that the time equivalent signal blocks have each a different segmentation for the prediction filter coefficients, the retrieval means further being adapted to retrieve second segment information for only one time equivalent signal block from the side information in the case that the second indicator word has the third value and is adapted to retrieve second segment information for each of the time equivalent signal blocks in the case that the second indicator word has the fourth value, the reconverting means being further adapted to copy the second segment information n-1 times so as to obtain the P segments of the time equivalent signal blocks of all n channel signals, in the case that the second indicator word has the third value.

26. Apparatus as claimed in claim 23, wherein the retrieval means is adapted to retrieve a third indicator word ($W_3$) from said side information, said third indicator word, when being of a fifth value, indicating that the time equivalent signal blocks all have the same segmentation for the probability tables, and when being of a sixth value, indicating that the time equivalent signal blocks have each a different segmentation for the probability tables, that the retrieval means is further adapted to retrieve first segment information for only one time equivalent signal block in the case that the third indicator word has the fifth value and is adapted to retrieve first segment information for each of the time equivalent signal blocks in the case that the third indicator word has the sixth value, and that the reconverting means is further adapted to copy the first segment information for said one time equivalent signal block n-1 times so as to obtain the M segments of the time equivalent signal blocks of all the n channel signals, in the case that the third indicator word has the fifth value.

27. Apparatus as claimed in claim 23, wherein the retrieval means is adapted to retrieve a fourth indicator word ($W_4$) from said side information, said fourth indicator word being of a seventh value, indicating that the mapping information for the probability tables is different from the mapping information for the sets of prediction filter coefficients and, when being of an eighth value, indicating that the mapping information for the probability tables is the same as for the prediction filter coefficients, that the retrieval means is further adapted to retrieve only one mapping information from the side information in the latter case, the reconverting means being further adapted to copy the mapping information retrieved in the case that the fourth indicator word has the eighth value.

28. Apparatus as claimed in claim 23, wherein the retrieval means is adapted to retrieve a fifth indicator word ($W_5$) from said side information, said fifth indicator word, when being of a ninth value, indicating that the time equivalent signal blocks all have the same mapping information for the prediction filter coefficients and, when being of a tenth value, indicating that the time equivalent signal blocks have each a different mapping information for the prediction filter coefficients, that the retrieval means are further adapted to retrieve second mapping information for only one time equivalent signal block in the case that the fifth indicator word has the ninth value and is adapted to retrieve second mapping information for each of the time equivalent signal blocks in the case that the fifth indicator word has the tenth value.

29. Apparatus as claimed in claim 23, wherein the retrieval means are adapted to retrieve a plurality of sets of prediction filter coefficients from said side information and to retrieve an array of bits from the second mapping information, the apparatus further comprising allocation means for allocating the first set of prediction coefficients to the first of said P segments, (a) the allocation means further being adapted to allocate the first set of prediction filter coefficients to the second segment in response to the first bit in the array of bits being of a first binary value and being adapted to allocate the second set of prediction filter coefficients to the second segment in response to the first bit being of the second binary value, (b1) if the first set of coefficients is also the set of filter coefficients for the second segment, then the allocation means is further adapted to allocate to allocate the first set of prediction filter coefficients to the third segment in response to the second bit in the array of bits being of a first binary value and is adapted to allocate the second set of prediction filter coefficients to the third segment in response to the second bit being of the second binary value, (b2) if the second set of coefficients is the set of filter coefficients for the second segment, then the allocation means is further adapted to allocate either the first or the second or the third set of prediction filter coefficients to the third segment in response to the values of the next two bits of the array of bits, (c1) if the first set of filter coefficients is the set of filter coefficients for the second and third segment, then the allocation means is further adapted to allocate either first or the second set of filter coefficients to the fourth segment in response to the value of the third bit of said array of bits, (c2) if the first set of prediction filter coefficients is the set of filter coefficients for the second segment and the second set of filter coefficients is the set of filter coefficients for the third segment, then the allocation means is further adapted to allocate either the first, or the second or the third set of prediction filter coefficients to the fourth segment in response to the values of the third and fourth bits in said array of bits, (c3) if the second set of prediction filter coefficients is the set of filter coefficients for the second segment, and the first or the second set of filter coefficients is the set of filters for the third segment, then the allocation means are adapted to allocate either the first, or second or the third set of filter coefficients to the fourth segment in response to the values of the fourth and fifth bit in the array of bits (c4) if the second set of prediction filter coefficients is the set of filter coefficients for the second segment, and the third set of filter coefficients is the set of filters for the third segment, then the allocation means are adapted to allocate either the first, or the second, or the third or the fourth set of filter coefficients to the fourth segment in response to the fourth and fifth bit in the array of bits.

30. Apparatus as claimed in claim 22, wherein the retrieval means are adapted to retrieve a plurality of probability tables from said side information and to retrieve an array of bits from the first mapping information, the apparatus further comprising allocation means for allocating the first probability table to the first of said M segments, (a) the allocation means further being adapted to allocate the first probability table to the second segment in response to the first bit in the array of bits being of a first binary value and being adapted to allocate the second probability table to the second segment in response to the first bit being of the second binary value, (b1) if the first probability table is also the probability table for the second segment, then the allocation means is further adapted to allocate the first probability table to the third segment in response to the second bit in the array of bits being of a first binary value and is adapted to allocate the second probability table to the third segment in response to the second bit being of the second binary value, (b2) if the second probability table is the probability table for the second segment, then the allocation means is further adapted to allocate either the first or the second or the third probability table to the third segment in response to the values of the next two bits of the array of bits, (c1) if the first probability table is the probability table for the second and third segment, then the allocation means is further adapted to allocate either first or the second probability table to the fourth segment in response to the value of the third bit of said array of bits, (c2) if the first probability table is the probability table for the second segment and the second probability table is the probability table for the third segment, then the allocation means is further adapted to allocate either the first, or the second or the third probability table to the fourth segment in response to the values of the third and fourth bits in said array of bits, (c3) if the second robability table is the probability table for the second segment, and the first or the second probability table is the probability table for the third segment, then the allocation means are adapted to allocate either the first, or second or the third probability table to the fourth segment in response to the values of the fourth and fifth bit in the array of bits (c4) if the second probability table is the probability table for the second segment, and the third probability table is the probability table for the third segment, then the allocation means are adapted to allocate either the first, or the second, or the third or the fourth probability table to the fourth segment in response to the fourth and fifth bit in the array of bits.

\* \* \* \* \*